US009563134B2

(12) United States Patent
Saito

(10) Patent No.: US 9,563,134 B2
(45) Date of Patent: Feb. 7, 2017

(54) OPTICAL SYSTEM ILLUMINATING SURFACE TO BE ILLUMINATED, EXPOSURE APPARATUS, IMPRINT APPARATUS, METHOD FOR MANUFACTURING ARTICLE, OPTICAL ELEMENT, AND METHOD FOR MANUFACTURING OPTICAL SYSTEM

(71) Applicant: CANON KABUSHIKI KAISHA, Tokyo (JP)

(72) Inventor: Nobuyuki Saito, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/558,555

(22) Filed: Dec. 2, 2014

(65) Prior Publication Data

US 2015/0153653 A1    Jun. 4, 2015

(30) Foreign Application Priority Data

Dec. 3, 2013    (JP) ................................. 2013-250399

(51) Int. Cl.
| | | |
|---|---|---|
| *G03B 27/54* | (2006.01) | |
| *G03B 27/72* | (2006.01) | |
| *G03F 7/20* | (2006.01) | |
| *G03F 7/00* | (2006.01) | |

(52) U.S. Cl.
CPC ......... *G03F 7/70375* (2013.01); *G03F 7/0002* (2013.01)

(58) Field of Classification Search
CPC .......................... G03F 7/70191; G03F 7/70375
USPC .................................. 355/52, 53, 55, 67–71
See application file for complete search history.

(56) References Cited

U.S. PATENT DOCUMENTS

| | | | | |
|---|---|---|---|---|
| 6,522,386 | B1 * | 2/2003 | Nishi ................... | G03F 7/70241 |
| | | | | 355/52 |
| 2006/0109443 | A1 * | 5/2006 | Toyoda ................ | G02B 3/0056 |
| | | | | 355/67 |

FOREIGN PATENT DOCUMENTS

| | | |
|---|---|---|
| JP | H06-134666 A | 5/1994 |
| JP | 2000-263408 A | 9/2000 |
| JP | 2004-226661 A | 8/2004 |

* cited by examiner

*Primary Examiner* — Hung Henry Nguyen
(74) *Attorney, Agent, or Firm* — Canon U.S.A., Inc. IP Division

(57) ABSTRACT

An optical system illuminating a surface to be illuminated includes a wavefront splitting type integrator configured to split the wavefront of incident light to form a plurality of light sources on the exit surface side, and an optical element whose surface is polished in a scanning direction using a polishing tool. The optical element is disposed between the wavefront splitting type integrator and the surface to be illuminated, and has a direction indicating portion indicating the scanning direction. The arrangement direction of the plurality of light sources in a plane perpendicular to the optical axis of the optical system is non-parallel to the scanning direction indicated by the direction indicating portion.

26 Claims, 6 Drawing Sheets

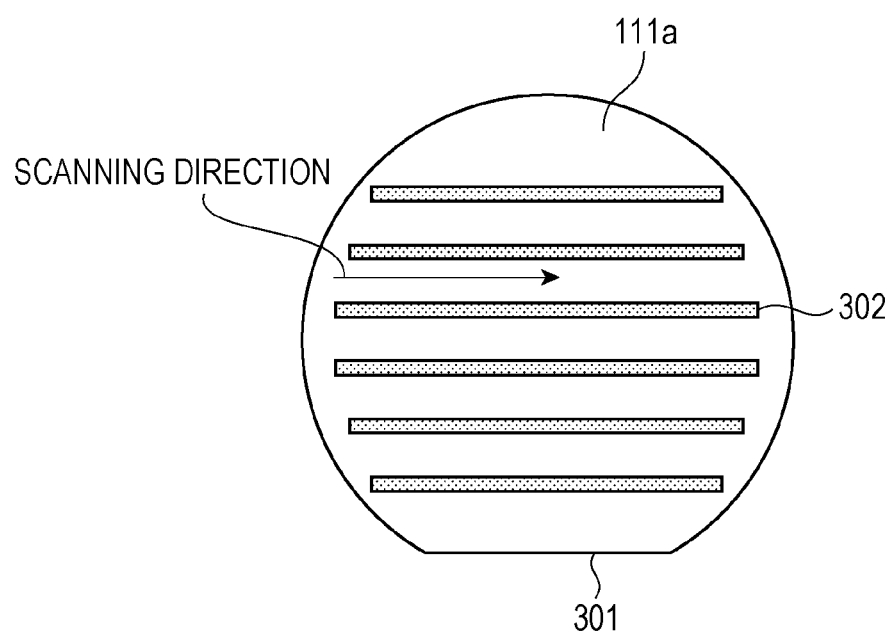

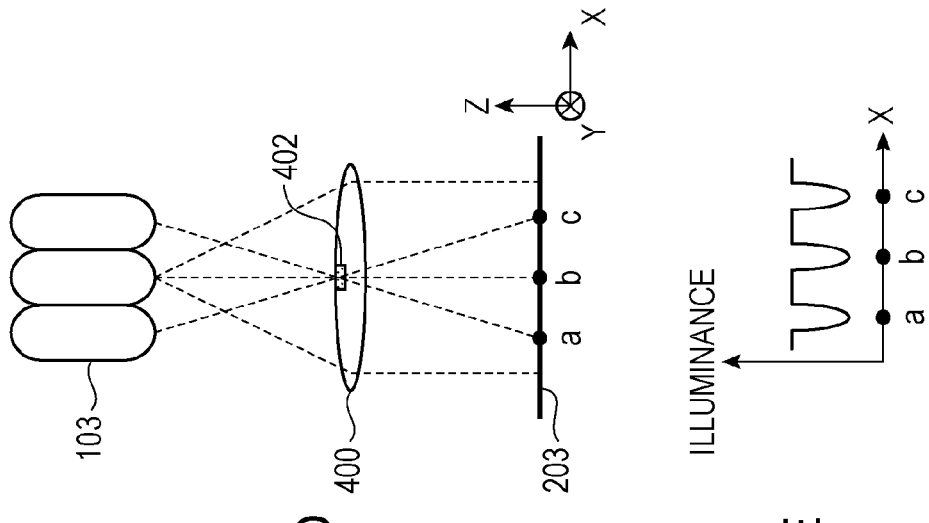
FIG. 4D
FIG. 4E
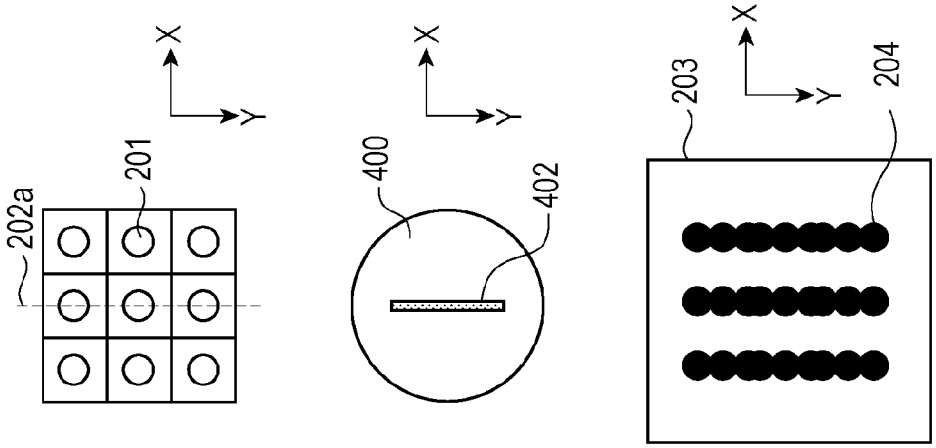
FIG. 4A
FIG. 4B
FIG. 4C

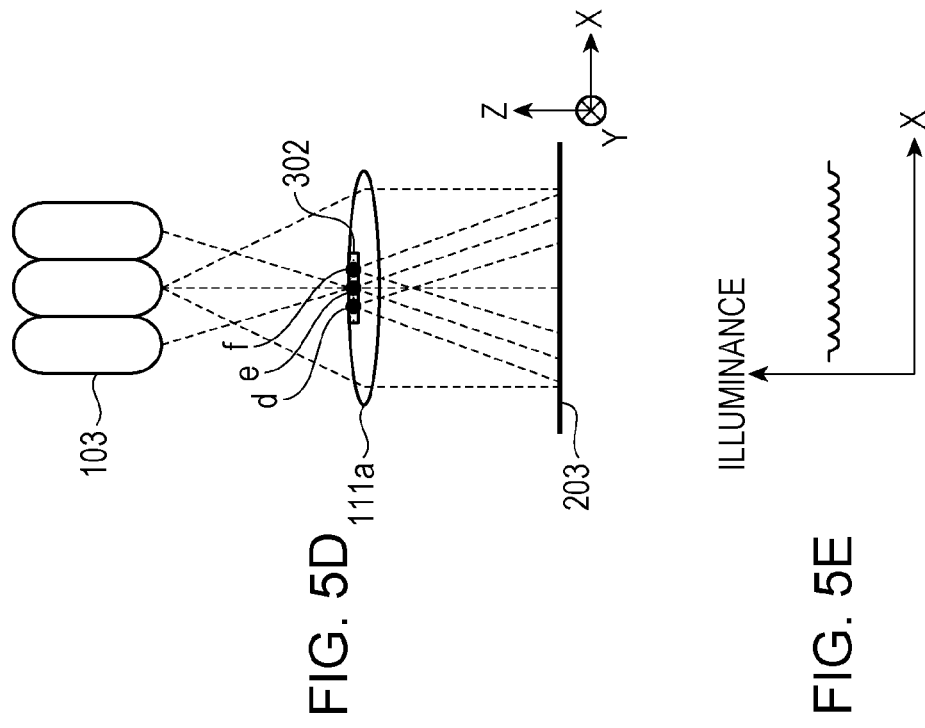
FIG. 5D
FIG. 5E
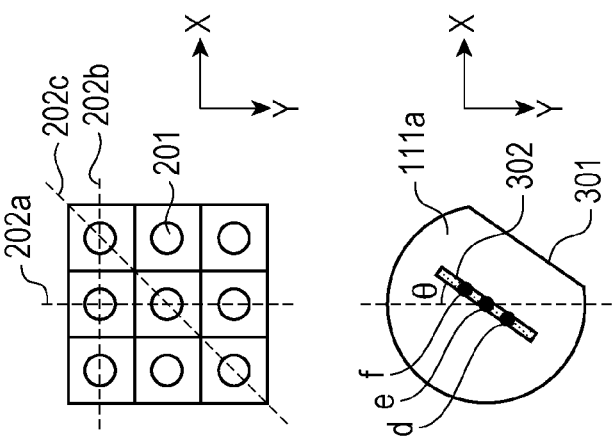
FIG. 5A
FIG. 5B
FIG. 5C

OPTICAL SYSTEM ILLUMINATING SURFACE TO BE ILLUMINATED, EXPOSURE APPARATUS, IMPRINT APPARATUS, METHOD FOR MANUFACTURING ARTICLE, OPTICAL ELEMENT, AND METHOD FOR MANUFACTURING OPTICAL SYSTEM

BACKGROUND OF THE INVENTION

Field of the Invention

The present invention relates to an optical system illuminating a surface to be illuminated, an exposure apparatus, an imprint apparatus, a method for manufacturing an article, an optical element, and a method for manufacturing an optical system.

Description of the Related Art

In the lithography process of the manufacturing of a semiconductor device, a liquid crystal display apparatus, or the like, an exposure apparatus is used that illuminates a mask (reticle) using an illumination optical system, and projects an image of a pattern of the mask through a projection optical system onto a substrate on which a photosensitive resist layer is formed.

In optical systems of an exposure apparatus, aspherical lenses for correcting various aberrations are used. Although an aspherical surface has a complicated shape, it requires high shape accuracy. So, in aspherical surface processing, a technique is used in which a minute polishing pad is scanned in a predetermined scanning direction while being in contact with the lens surface to polish the surface (Japanese Patent Laid-Open No. 2000-263408).

However, if a polishing pad is scanned in a predetermined scanning direction to polish the surface of an optical element as in Japanese Patent Laid-Open No. 2000-263408, linear polishing marks are left on the surface of the optical element along the scanning direction. Light is not easily transmitted through the polishing mark parts. Therefore, if a surface to be illuminated (substrate) is illuminated using an optical element having polishing marks, shadows such that light from the light source is blocked by the polishing marks are projected onto the surface to be illuminated. If, in an optical system of an exposure apparatus, significantly uneven illuminance is caused by shadows cast on the surface to be illuminated, a line width abnormality of the exposure pattern projected onto the substrate can occur. If, for example, linear polishing marks are about 1 mm in width, and uneven illuminance of 0.05% or more is caused by them, a line width abnormality of the exposure pattern can occur.

SUMMARY OF THE INVENTION

In an aspect of the present invention, an optical system illuminating a surface to be illuminated includes a wavefront splitting type integrator configured to split the wavefront of incident light to form a plurality of light sources on the exit surface side, and an optical element whose surface is polished in a scanning direction using a polishing tool. The optical element is disposed between the wavefront splitting type integrator and the surface to be illuminated, and has a direction indicating portion indicating the scanning direction. The arrangement direction of the plurality of light sources in a plane perpendicular to the optical axis of the optical system is non-parallel to the scanning direction indicated by the direction indicating portion.

Further features of the present invention will become apparent from the following description of exemplary embodiments with reference to the attached drawings.

BRIEF DESCRIPTION OF THE DRAWINGS

FIG. 3 is a plan view of an aspherical lens.

FIGS. 4A to 4E illustrate uneven illuminance caused by a conventional aspherical lens.

FIGS. 5A to 5E illustrate uneven illuminance caused by an aspherical lens of an embodiment.

DESCRIPTION OF THE EMBODIMENTS

Embodiments of the present invention will now be described in detail with reference to the drawings.

First Embodiment

Figure 1:
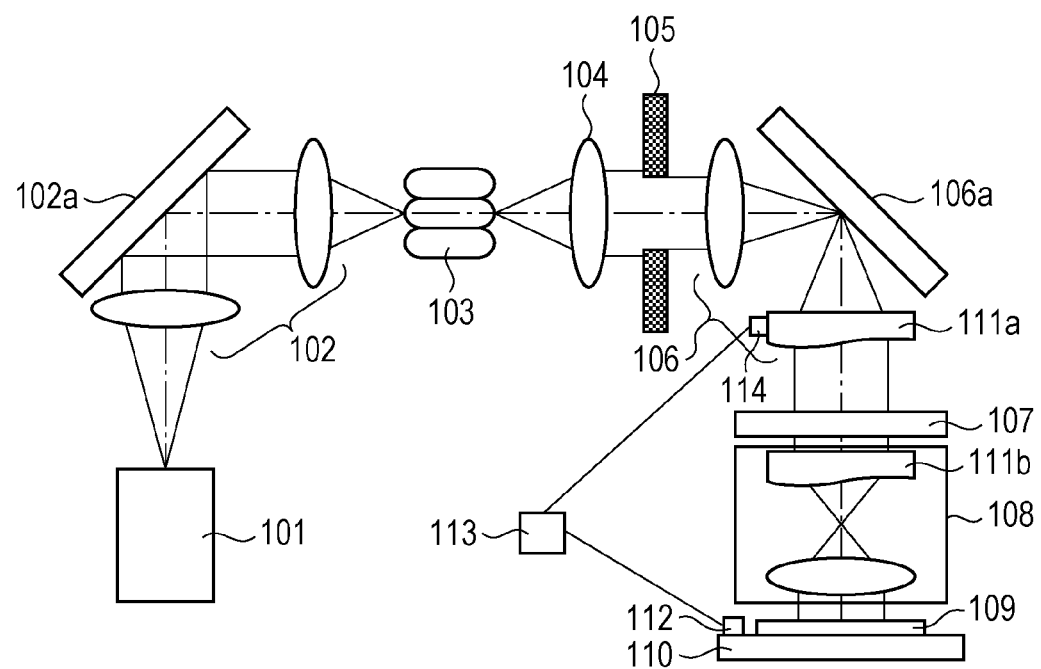
FIG. 1 is a schematic view of an exposure apparatus.

FIG. 1 is a schematic view showing the constitution of an exposure apparatus 100 in a first embodiment.

The exposure apparatus 100 causes light from a light source 101 to be incident on an integrator 103 through a light beam shaping portion 102. The light beam shaping portion 102 can change the shape and size in cross-section of a light beam incident on the integrator 103. The light beam shaping portion 102 bends the optical path in the middle of the optical path using a mirror 102a. The integrator 103 has a function of uniformizing the illuminance distribution of a surface to be illuminated. Light emitted from the integrator 103 illuminates a visual field (illumination field) stop 105 through a condenser lens 104. The visual field stop 105 is for limiting the range of illumination of a mask 107. The visual field stop 105 and the mask 107 are in an image forming relationship owing to an image forming optical system 106. The image forming optical system 106 bends the optical path in the middle of the optical path using a mirror 106a. The light beam shaping portion 102, the integrator 103, the condenser lens 104, the visual field stop 105, and the image forming optical system 106 form an illumination optical system that illuminates the mask 107. A pattern used for forming a circuit is formed on the mask 107. Light from the pattern of the mask 107 illuminated by the illumination optical system is imaged by a projection optical system 108 onto a wafer (substrate) 109 held on a wafer stage 110.

The image forming optical system 106 has an aspherical lens 111a for correcting the telecentricity of light with which the surface to be illuminated (mask surface) is irradiated. The projection optical system 108 has an aspherical lens 111b for correcting the aberration of the projection optical system. The illumination optical system illuminates the mask 107, which is a surface to be illuminated, and the projection optical system 108 illuminates the wafer 109, which is a surface to be illuminated.

Figure 2A:
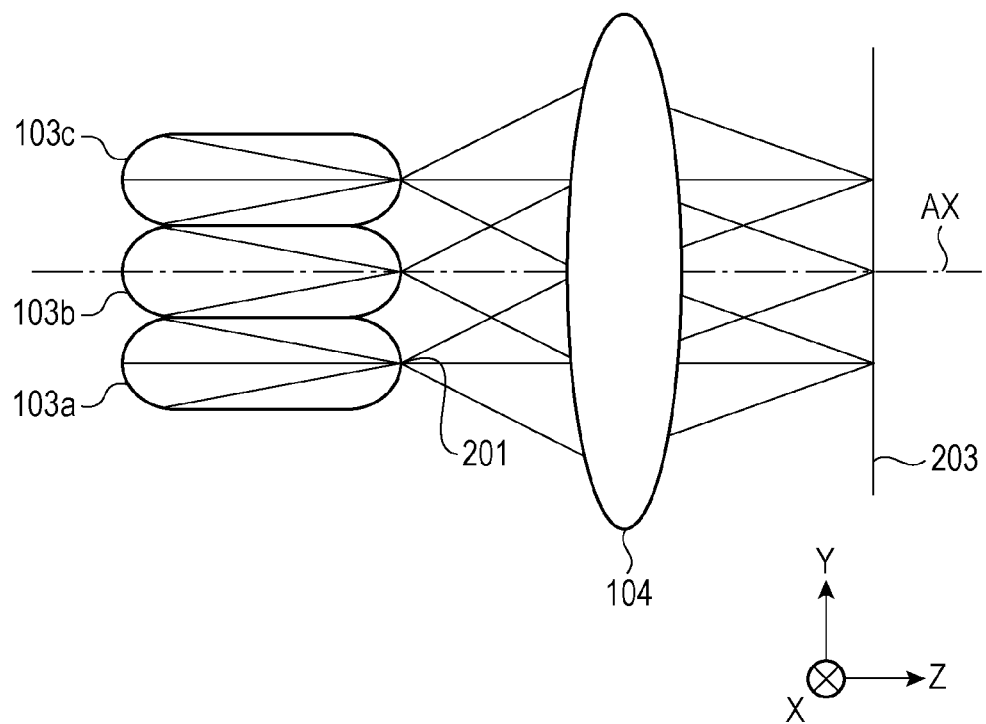
FIGS. 2A and 2B show the constitution of an integrator.
Figure 2B:
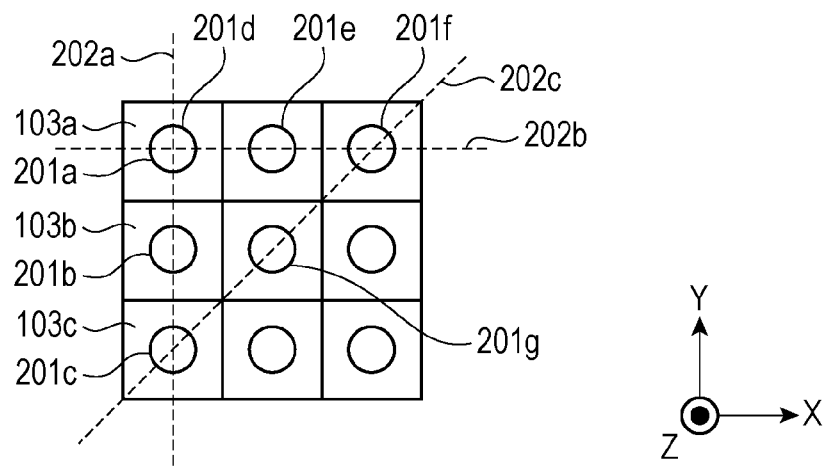

FIGS. 2A and 2B show the constitution of the integrator 103. As shown in FIG. 2A, the integrator 103 is a wavefront splitting type integrator that splits the wavefront of incident light to form a plurality of secondary light sources 201 on the exit surface side. The integrator 103 shown in FIGS. 2A and 2B is a fly-eye lens. The integrator 103 has a plurality of lens elements such as lens elements 103a, 103b, and 103c constituting the fly-eye lens. Light from the secondary light sources 201 formed by the lens elements illuminates a surface to be illuminated 203 in a superimposed manner through the condenser lens 104, and performs Köhler illumination. The surface to be illuminated 203 corresponds to the wafer 109 surface, the mask 107 surface, or a surface conjugate with them.

FIG. 2B shows a sectional view of the integrator 103 in an xy sectional plane perpendicular to the optical axis AX (z direction). The plurality of secondary light sources 201 formed by the plurality of lens elements of the integrator 103 are arranged in two directions perpendicular to each other (vertical and horizontal directions) and an oblique direction. For example, the secondary light sources 201a, 201b, and 201c formed by the lens elements 103a, 103b, and 103c are arranged in the vertical direction (y direction) 202a. The secondary light sources 201d, 201e, and 201f are arranged in the horizontal direction (x direction) 202b, and the secondary light sources 201c, 201g, and 201f are arranged in the oblique direction 202c. Since, in a fly-eye lens, lens elements correspond one-to-one with secondary light sources formed by the lens elements, the arrangement directions of the secondary light sources are the same as the arrangement directions of the lens elements.

In order to improve the light use efficiency, the outer shape of the lens elements of the integrator 103 is generally similar to an illumination region that illuminates the surface to be illuminated 203. Therefore, the arrangement directions of the plurality of lens elements (secondary light sources) of the integrator 103 are set according to the illumination region of the surface to be illuminated 203. The integrator 103 is not limited to a fly-eye lens. As described in Japanese Patent Laid-Open No. 2004-226661, a microlens array in which a plurality of microlenses are formed two-dimensionally, or a combination of two cylindrical lens arrays whose generatrix directions are perpendicular to each other can be used. Alternatively, a diffraction type optical element, a CGH, an internal reflection type optical pipe (integrator), or the like can be used.

Next, the aspherical lens 111a will be described. The aspherical lens 111a is polished using a polishing apparatus such as that described in Japanese Patent Laid-Open No. H06-134666 or 2000-263408. That is, the polishing apparatus pours polishing liquid on a workpiece (lens), or places the workpiece in the polishing liquid. Then, a polishing tool (polishing pad) having a diameter smaller than the workpiece is pressed against the surface of the workpiece with a given load, and the polishing tool is scanned relative to the surface of the workpiece to polish and remove unnecessary parts from the workpiece. The polishing apparatus includes the polishing tool, a holder for the polishing tool, and a moving shaft to which a load generator is fixed and that uses an actuator as a driving source. The polishing apparatus further includes a position detecting unit that detects the current position of the moving shaft, a position setting unit that sets a target position, and a control unit that drives the moving shaft, and compares a position signal from the position detecting unit with a value of the position setting unit. The polishing apparatus includes a calculator that calculates a target position of the moving shaft on the basis of this comparison result and sends a control signal to the control unit on the basis of this calculation result. The polishing apparatus freely sets the scanning width in a direction perpendicular to the scanning direction while scanning the polishing tool in one scanning direction, thereby polishing the lens surface.

FIG. 3 shows a plan view of the aspherical lens 111a. The surface of the aspherical lens 111a is polished using the polishing tool of the polishing apparatus in the scanning direction, and linear polishing marks 302 are left on the surface of the aspherical lens 111a along the scanning direction. The polishing marks 302 are actually less visible but are schematically shown in the figure. The polishing marks cause an optical phenomenon such as light blocking, scattering, or refraction, and light is not easily transmitted therethrough. Therefore, if a surface to be illuminated is illuminated using an optical element having polishing marks, shadows such that light from the light source is blocked by the polishing mark regions are projected onto the surface to be illuminated.

FIGS. 4A to 4E show uneven illuminance on the surface to be illuminated 203 in the case where assembly is performed such that the arrangement direction 202a of the secondary light sources 201 formed by the integrator 103 is parallel to the direction in which a polishing mark 402 of a conventional aspherical lens 400 extends. Suppose the aspherical lens 400 is also polished using the above-described polishing apparatus, and a polishing mark is formed in the scanning direction. FIG. 4A shows a sectional view of the integrator 103 in an xy sectional plane perpendicular to the optical axis. FIG. 4B shows a sectional view of the aspherical lens 400 in an xy sectional plane perpendicular to the optical axis. FIG. 4C shows uneven illuminance on the surface to be illuminated 203 in an xy plane perpendicular to the optical axis. FIG. 4D is a configuration diagram of the integrator 103 and the aspherical lens 400 in an xz plane. FIG. 4E shows the illuminance distribution on the surface to be illuminated 203 in the x direction.

A plurality of light beams from the plurality of secondary light sources 201 are incident on points on the polishing mark 402, and the illuminance of light projected onto the surface to be illuminated 203 from a plurality of directions decreases owing to the scattering when the plurality of light beams pass through the points on the polishing mark 402. FIGS. 4D and 4E show the decrease in illuminance at points a, b, and c on the surface to be illuminated 203. As shown in FIGS. 4A and 4B, the arrangement direction 202a of the secondary light sources 201 formed by the integrator 103 and the polishing mark 402 of the aspherical lens 400 are disposed in the y direction so as to be parallel to each other. Therefore, shadows 204 in which the illuminance is decreased by a point on the polishing mark 402 and that have the shape of the nine secondary light sources 201 are formed on the surface to be illuminated 203. Since the polishing mark 402 extends in the y direction, shadows are formed by each point on the polishing mark 402 in the same manner, and illuminance distribution such that shadows of light beams from the secondary light sources are arranged in lines so as to overlap each other in the y direction is formed on the surface to be illuminated 203. Therefore, significantly uneven illuminance such that the illuminance periodically decreases in the x direction occurs on the surface to be illuminated 203. If such uneven illuminance occurs, the surface to be illuminated 203 is illuminated unevenly, and therefore a resolution error such that the image of the mask pattern projected onto the wafer 109 becomes abnormal occurs. A line width abnormality of the pattern formed on the wafer 109 can occur.

So, in this embodiment, the arrangement direction of the secondary light sources 201 formed by the integrator 103 and the direction in which the polishing mark 302 of the aspherical lens 111a extends are disposed so as to be non-parallel to each other (so as not to be parallel to each other).

FIGS. 5A to 5E show uneven illuminance on the surface to be illuminated 203 in the case where assembly is performed such that the arrangement direction of the plurality of secondary light sources 201 formed by the integrator 103 is non-parallel to the direction in which the polishing mark 302 of the aspherical lens 111a extends. FIG. 5A shows a sectional view of the integrator 103 in an xy sectional plane perpendicular to the optical axis. FIG. 5B shows a sectional view of the aspherical lens 111a in an xy sectional plane perpendicular to the optical axis. FIG. 5C shows uneven illuminance on the surface to be illuminated 203 in an xy plane perpendicular to the optical axis. FIG. 5D is a configuration diagram of the integrator 103 and the aspherical lens 111a in an xz sectional plane. FIG. 5E shows the illuminance distribution on the surface to be illuminated 203 in the x direction.

As shown in FIG. 5B, the direction in which the polishing mark 302 extends is non-parallel to any of the arrangement directions 202a (y direction), 202b (x direction), and 202c (45-degree direction to the x and y axes) of the secondary light sources 201. The arrangement direction 202a of the secondary light sources (y direction) and the direction in which the polishing mark 302 extends form a predetermined angle θ that is greater than 0 degrees (y direction) and less than 90 degrees and is not 45 degrees. As shown in FIGS. 5B and 5D, the illuminance of light projected onto the surface to be illuminated 203 through points on the polishing mark 302, for example, points d, e, and f decreases. Since the polishing mark 302 is inclined at the angle θ to the y direction, as shown in FIG. 5C, illuminance distribution such that shadows 205 of light beams from the light sources are arranged in lines so as to overlap each other in a direction inclined at the angle θ to the y direction is formed on the surface to be illuminated 203. The illuminance distribution on the surface to be illuminated 203 in the x direction is as shown in FIG. 5E. That is, shadows 205 of light beams from the light sources are not locally concentrated but evenly distributed throughout the surface to be illuminated 203, and illuminance distribution such that shadows are evenly spread is formed. Therefore, illuminance distribution that is more even than the periodic and significantly uneven illuminance distribution of the illuminated state of FIG. 4C can be formed.

In this embodiment, the aspherical lens 111a is provided with a direction indicating portion 301 that indicates the direction in which the polishing marks 302 extend. As shown in FIG. 3, the direction indicating portion 301 is a plane portion formed by cutting off an outer peripheral part of the aspherical lens 111a in a direction parallel to the direction in which the polishing marks 302 extend. When the aspherical lens 111a is disposed in the optical path of the illumination optical system, the aspherical lens 111a is disposed such that the arrangement directions of the secondary light sources 201 are non-parallel to the direction in which the polishing marks 302 extend, using the direction indicating portion 301 as a guide. As described above, the arrangement directions of the plurality of secondary light sources formed by the integrator 103 are set in advance for each apparatus according to the region of the mask (wafer) to be illuminated by the exposure apparatus. Therefore, the aspherical lens 111a can be disposed such that the direction in which the polishing marks 302 extend is non-parallel to the arrangement directions of the secondary light sources, easily by using the direction indicating portion 301. By disposing the integrator 103 and the aspherical lens 111a in the optical path in this manner, an optical system can be manufactured.

The term "non-parallel" shows a relationship between the arrangement directions of the secondary light sources and the direction in which the polishing marks extend in a state where the optical axis of the integrator 103 is parallel to the optical axis of the aspherical lens 111a. In the optical path of FIG. 1, since the optical path of light from the integrator 103 is bent at a right angle in the middle and is incident on the aspherical lens 111a, the optical axis of the integrator 103 is perpendicular to the optical axis of the aspherical lens 111a. So, suppose a state where a plane perpendicular to the optical axis of the integrator 103 is overlaid on a plane perpendicular to the optical axis of the aspherical lens 111a with a direction perpendicular to the paper plane common, and the optical axis of the integrator 103 is parallel to the optical axis of the aspherical lens 111a. In this state, the arrangement directions of the secondary light sources 201 are non-parallel to the direction in which the polishing marks 302 extend.

The direction indicating portion 301 is not limited to the above-described plane portion, and may be a straight line engraved on the outer peripheral part of the lens so as to extend in the direction in which the polishing marks 302 extend, or a straight line or plane portion formed in a direction perpendicular to the direction in which the polishing marks 302 extend. That is, the direction indicating portion 301 may have any form as long as it can indicate the direction in which the polishing marks 302 extend and the direction in which the polishing marks 302 extend can be detected on the basis of the appearance of the direction indicating portion by human sight or a detector of the apparatus. For example, a step extending in the direction in which the polishing marks 302 extend may be formed in an outer peripheral part of the lens, and the outer peripheral part of the lens may not be completely cut off. Since, in this case, the whole circumference of the shape of one side surface of the lens remains, the whole circumference of the one side surface of the lens can be held with a lens holding frame.

The aspherical lens 111a may be provided with a mechanism rotatable about the optical axis. The angle of the direction indicated by the direction indicating portion 301 can be adjusted at any timing, for example, when the arrangement of the aspherical lens 111a is adjusted, or when the illuminance distribution is changed with time. The aspherical lens 111a may be provided with a drive mechanism 114 such as an actuator for rotating the aspherical lens 111a about the optical axis to adjust the illuminance distribution. First, the illuminance distribution on the image plane (surface to be illuminated 203) is measured using a measurement device (measurement portion) 112 on the wafer stage 110. Then, a control portion 113 (adjusting portion) acquires the data of the result of measurement performed by the measurement device 112, drives a drive mechanism 114 on the basis of the acquired measurement result to adjust the rotation angle of the aspherical lens 111a about the optical axis. By doing this, the illuminance distribution can be improved so as to be more even. When rotating the aspherical lens 111a about the optical axis, the control portion 113 can perform control using the angle of the direction indicated by the direction indicating portion 301 as a control amount.

Figure 6:
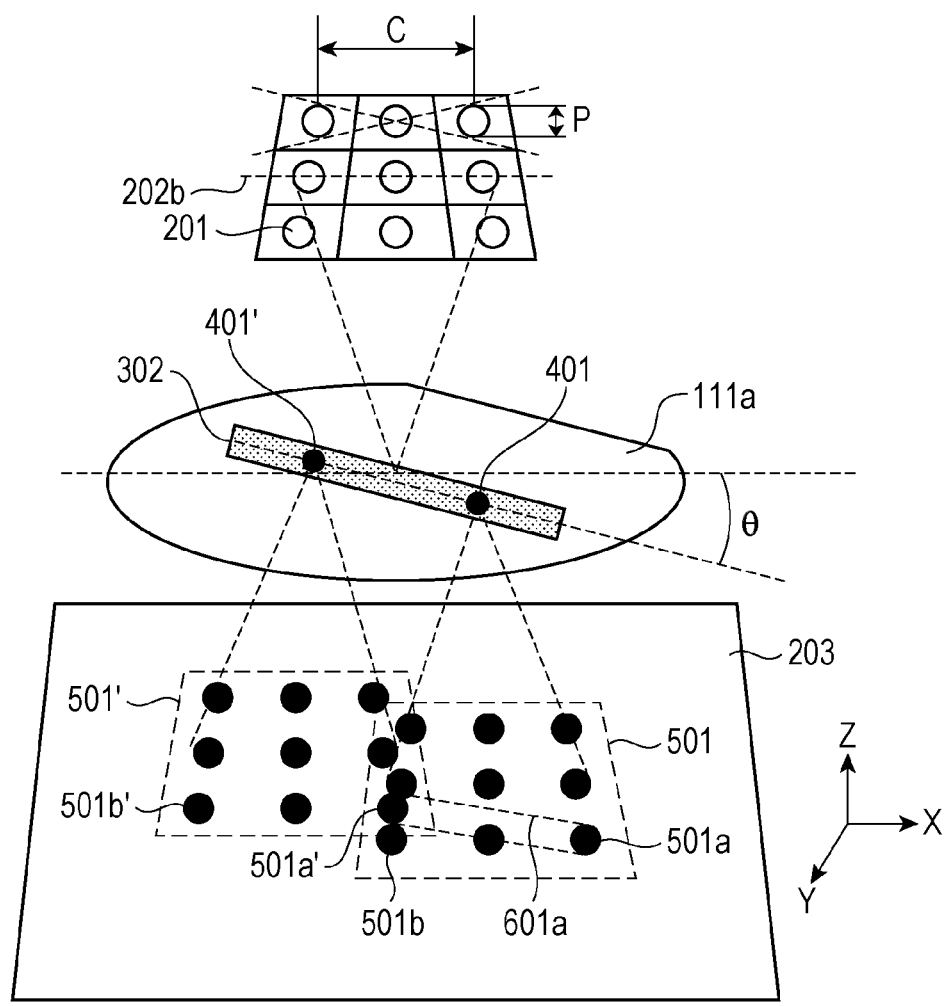
FIG. 6 shows the relationship between the arrangement direction of secondary light sources and the direction of a polishing mark.

FIG. 6 is a diagram for illustrating a preferable angle formed between the arrangement direction of the secondary light sources 201 and the direction in which the polishing marks 302 extend. The black dots in the region 501 including shadows show shadows of light beams from the secondary light sources projected from a point 401 on the polishing mark 302. The black dots in the region 501' including shadows show shadows of light beams from the secondary light sources projected from a point 401' on the polishing mark that is farthest from the point 401 of all points from which shadows of light beams from the secondary light sources are projected onto a position overlapping the region 501. The shadow 501*a* shows a shadow of a light beam from one of the most off-axis lens element of the integrator 103 in the region 501, and the shadow 501*b* shows a shadow of a light beam from one of the most off-axis lens element located on the side opposite to the shadow 501*a*. Similarly, the shadows 501*a*' and 501*b*' are shadows of light beams from lens elements corresponding to shadows 501*a* and 501*b* in the region 501'.

The angle θ of the direction of the polishing mark 302 with respect to the arrangement direction of the secondary light sources 201 (x direction) can be greater than or equal to $\tan^{-1}$ (C/P), where C is the size in the x direction of the whole distribution of the plurality of secondary light sources 201 formed by the integrator 103, and P is the external diameter of one or more, or all of the secondary light sources 201. FIG. 6 shows a state where shadows of light beams from the secondary light sources 201 are projected onto the surface to be illuminated 203 when the angle θ with respect to the arrangement direction 202*b* of the secondary light sources 201 is greater than or equal to $\tan^{-1}$ (C/P). Since the angle θ is greater than or equal to $\tan^{-1}$ (C/P), the shadow 501*b* does not overlap the line region 601*a* connecting the shadow 501*a* and the shadow 501*a*'. Therefore, the amount of decrease of the illuminance in the line region 601*a* is reduced, and as a result, the occurrence of a significant local decrease in illuminance can be suppressed.

The aspherical lens 111*b* in FIG. 1 also has polishing marks as with the aspherical lens 111*a* and has a direction indicating portion. So, when the aspherical lens 111*b* is disposed in the optical path of the projection optical system, the aspherical lens 111*b* is disposed such that the arrangement directions of the secondary light sources 201 are non-parallel to the direction in which the polishing marks of the aspherical lens 111*b* extend, using the direction indicating portion of the aspherical lens 111*b* as a guide.

An aspherical lens has been described as an example of a lens having polishing marks. However, this embodiment can be applied not only to this but also to optical elements such as a spherical lens and a parallel plate whose surfaces are polished in the scanning direction using the above-described polishing apparatus.

The location and number of optical elements to which this embodiment can be applied are not limited. However, the closer to the surface to be illuminated 203 or a surface conjugate with the surface to be illuminated an optical element is disposed, the more clearly shadows of light beams from the secondary light sources due to the polishing marks are projected onto the surface to be illuminated 203, and therefore the more significantly the uneven illuminance on the surface to be illuminated 203 is worsened. Therefore, it is recommended that the optical element closest to the surface to be illuminated or a surface conjugate therewith of all the optical elements constituting the optical system, or an optical element disposed in the vicinity of those surfaces be incorporated such that the arrangement directions of the secondary light sources are non-parallel to the direction of the polishing marks. By doing this, worsening of uneven illuminance can be suppressed more effectively.

The scanning direction in which the surface of an optical element is polished by the polishing tool is not limited to one direction. There is a case where, first, the polishing tool is scanned in a first direction A to polish the surface, and then the polishing tool is scanned in a second direction B perpendicular to the first direction A to polish the surface. In the case where there are a plurality of scanning directions of the polishing tool, linear polishing marks are left on the surface of the optical element along the last-scanned second direction B. So, an optical element polished by scanning in a plurality of directions is provided with a direction indicating portion by which the last-scanned second direction B can be detected.

The direction indicating portion indicating the direction in which polishing marks extend may be formed on a holding frame holding a lens.

The constitution of the above-described illumination optical system can also be applied to apparatuses other than an exposure apparatus, for example, a nano-imprint apparatus and a liquid crystal projector.

As described above, according to this embodiment, uneven illuminance can be reduced in an optical system including an optical element having polishing marks.

Second Embodiment

Next, a method for manufacturing an article (a semiconductor IC element, a liquid crystal display element, a filter, or the like) using the above-described exposure apparatus will be described. A device is manufactured through a step of exposing a substrate (a wafer, a glass substrate, or the like) coated with photoresist, using the above-described exposure apparatus, a step of developing the substrate (photoresist), and other known steps. Other known steps include etching, resist removing, dicing, bonding, and packaging. An article can also be manufactured using a nano-imprint apparatus equipped with the above-described illumination optical system. That is, with a pattern of a mold pressed against a light curing resin on a substrate, the light curing resin is illuminated through the mold to harden the light curing resin. Then, the mold is separated from the light curing resin. Thus, the pattern of the mold is formed in the light curing resin. Then, a desired pattern is formed on the substrate using the pattern formed in the light curing resin, and processing such as etching is performed on the substrate on which the pattern is formed. Thus, an article is formed. According to this manufacturing method, an article having higher quality than ever before can be manufactured.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-250399 filed Dec. 3, 2013, which is hereby incorporated by reference herein in its entirety.

What is claimed is:

1. An optical system illuminating a surface to be illuminated, comprising:
   an integrator configured to form a plurality of secondary light sources from light from a light source; and
   an optical element configured to have a polished surface which is polished by scanning in a scanning direction with a polishing tool,
   wherein the optical element is disposed between the integrator and the surface to be illuminated, and has a direction indicating portion indicating the scanning direction, and
   an arrangement direction of the plurality of secondary light sources in a plane perpendicular to an optical axis of the optical system is non-parallel to the scanning direction indicated by the direction indicating portion.

2. The optical system according to claim 1, wherein the direction indicating portion is a surface formed in an outer periphery of the optical element and parallel to the scanning direction.

3. The optical system according to claim 1, wherein the optical element is an aspherical lens.

4. The optical system according to claim 1, wherein the optical element is closest to the surface to be illuminated among a plurality of optical elements constituting the optical system.

5. The optical system according to claim 1, wherein an angle formed between the arrangement direction of the plurality of secondary light sources and the scanning direction indicated by the direction indicating portion is greater than or equal to $\tan^{-1}$ (C/P), where C is a size in the arrangement direction in a whole distribution of the plurality of secondary light sources formed by the integrator, and P is an external diameter of a light source among the plurality of secondary light sources.

6. The optical system according to claim 1, wherein the plurality of secondary light sources are arranged in two directions perpendicular to each other and a direction oblique to the two directions, and the scanning direction indicated by the direction indicating portion is non-parallel to the two directions and the oblique direction.

7. The optical system according to claim 1, wherein the optical element is rotatable about the optical axis.

8. The optical system according to claim 7, further comprising a measurement portion configured to measure illuminance distribution on the surface to be illuminated, and an adjusting portion configured to adjust a rotation angle of the optical element about the optical axis using a result of measurement performed by the measurement portion.

9. An optical system illuminating a surface to be illuminated, comprising:
an integrator configured to form a plurality of secondary light sources from light from a light source; and
an optical element configured to have a linear polishing mark,
wherein the optical element is disposed between the integrator and the surface to be illuminated, and has a direction indicating portion indicating a direction in which the polishing mark extends, and
an arrangement direction of the plurality of secondary light sources in a plane perpendicular to an optical axis of the optical system is non-parallel to the direction in which the polishing mark extends indicated by the direction indicating portion.

10. An exposure apparatus having an optical system that illuminates a mask and projects an image of a pattern of the mask onto a substrate,
wherein the optical system is the optical system according to claim 1.

11. A method for manufacturing an article, comprising:
exposing a substrate using the exposure apparatus according to claim 10;
developing the exposed substrate; and
manufacturing an article by processing the developed substrate.

12. An imprint apparatus having an optical system that illuminates a light curing resin on a substrate through a mold,
wherein the optical system is the optical system according to claim 1.

13. A method for manufacturing an article, comprising:
forming a pattern in a substrate using the imprint apparatus according to claim 12; and
manufacturing an article by processing the substrate in which the pattern is formed.

14. The optical system according to claim 9, wherein the direction indicating portion is a surface formed in an outer periphery of the optical element and parallel to the direction in which the polishing mark extends.

15. The optical system according to claim 9, wherein the optical element is an aspherical lens.

16. The optical system according to claim 9, wherein the optical element is closest to the surface to be illuminated among a plurality of optical elements constituting the optical system.

17. The optical system according to claim 9, wherein an angle formed between the arrangement direction of the plurality of secondary light sources and the direction indicated by the direction indicating portion is greater than or equal to $\tan^{-1}$ (C/P), where C is a size in the arrangement direction in a whole distribution of the plurality of secondary light sources formed by the integrator, and P is an external diameter of a light source among the plurality of secondary light sources.

18. The optical system according to claim 9, wherein the plurality of secondary light sources are arranged in two directions perpendicular to each other and a direction oblique to the two directions, and the direction indicated by the direction indicating portion is non-parallel to the two directions and the oblique direction.

19. The optical system according to claim 9, wherein the optical element is rotatable about the optical axis.

20. The optical system according to claim 19, further comprising a measurement portion configured to measure illuminance distribution on the surface to be illuminated, and an adjusting portion configured to adjust a rotation angle of the optical element about the optical axis using a result of measurement performed by the measurement portion.

21. The optical system according to claim 9, wherein the integrator is a wavefront splitting type integrator configured to split a wavefront of incident light to form the plurality of secondary light sources on an exit surface side.

22. An exposure apparatus having an optical system that illuminates a mask and projects an image of a pattern of the mask onto a substrate,
wherein the optical system is the optical system according to claim 9.

23. A method for manufacturing an article, comprising:
exposing a substrate using the exposure apparatus according to claim 22;
developing the exposed substrate; and
manufacturing an article by processing the developed substrate.

24. An imprint apparatus having an optical system that illuminates a light curing resin on a substrate through a mold,
wherein the optical system is the optical system according to claim 9.

25. A method for manufacturing an article, comprising:
forming a pattern in a substrate using the imprint apparatus according to claim 24; and
manufacturing an article by processing the substrate in which the pattern is formed.

26. The optical system according to claim 1, wherein the integrator is a wavefront splitting type integrator configured to split a wavefront of incident light to form the plurality of secondary light sources on an exit surface side.

* * * * *